United States Patent
Zhao et al.

(10) Patent No.: US 12,294,009 B2
(45) Date of Patent: May 6, 2025

(54) DISPLAY PANEL AND METHOD FOR MANUFACTURING SAME

(71) Applicants: Huizhou China Star Optoelectronics Display Co., Ltd., Guangdong (CN); TCL China Star Optoelectronics Technology Co., Ltd., Guangdong (CN)

(72) Inventors: Bin Zhao, Guangdong (CN); Juncheng Xiao, Guangdong (CN); Xiaodan Lin, Guangdong (CN)

(73) Assignees: Huizhou China Star Optoelectronics Display Co., Ltd., Huizhou (CN); TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/622,884

(22) PCT Filed: Dec. 17, 2021

(86) PCT No.: PCT/CN2021/139183
§ 371 (c)(1),
(2) Date: Dec. 27, 2021

(87) PCT Pub. No.: WO2023/103041
PCT Pub. Date: Jun. 15, 2023

(65) Prior Publication Data
US 2024/0038775 A1    Feb. 1, 2024

(30) Foreign Application Priority Data

Dec. 9, 2021    (CN) .......................... 202111498857.7

(51) Int. Cl.
*H01L 27/12*    (2006.01)
*H01L 25/16*    (2023.01)

(52) U.S. Cl.
CPC .......... *H01L 27/124* (2013.01); *H01L 25/167* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 2021/0055594 A1* | 2/2021 | Zheng | G02F 1/13452 |
| 2021/0066437 A1* | 3/2021 | Ryu | H10K 59/131 |
| 2021/0305473 A1 | 9/2021 | Wakamatsu et al. | |

FOREIGN PATENT DOCUMENTS

| | | |
|---|---|---|
| CN | 102662259 | 9/2012 |
| CN | 205318069 | 6/2016 |

(Continued)

OTHER PUBLICATIONS

Machine-generated English translation of JP 2004207542 (Year: 2004).*

(Continued)

*Primary Examiner* — Bo B Jang (57) ABSTRACT

A display panel and a method for manufacturing the same are provided. The display panel includes a first bonding area and a second bonding area connected to the first bonding area. The display panel further includes a substrate and a bonding wiring layer. A thickness of a part of the substrate in the second bonding area is less than a thickness of a part of the substrate in the first bonding area. The bonding wiring layer is disposed on surfaces of the parts of the substrate in the first bonding area and the second bonding area. A side surface of the bonding wiring layer away from the first bonding area and a side surface of the substrate away from the first bonding area are located on a same plane.

17 Claims, 4 Drawing Sheets

(56) References Cited

FOREIGN PATENT DOCUMENTS

| | | |
|---|---|---|
| CN | 108241240 | 7/2018 |
| CN | 109768052 | 5/2019 |
| CN | 109949703 | 6/2019 |
| CN | 110579916 | 12/2019 |
| CN | 111223879 | 6/2020 |
| CN | 111799240 | 10/2020 |
| CN | 112017969 | 12/2020 |
| CN | 112447768 | 3/2021 |
| CN | 113421489 | 9/2021 |
| CN | 113629067 | 11/2021 |
| JP | 2004-207542 | 7/2004 |

OTHER PUBLICATIONS

Notification of Office Action and Search Report Dated Feb. 3, 2024 From the State Intellectual Property Office of the People's Republic of China Re. Application No. 202111498857.7 and Its Translation Into English. (13 Pages).

* cited by examiner

DISPLAY PANEL AND METHOD FOR MANUFACTURING SAME

RELATED APPLICATIONS

This application is a National Phase of PCT Patent Application No. PCT/CN2021/139183 having International filing date of Dec. 17, 2021, which claims the benefit of priority of Chinese Patent Application No. 202111498857.7 filed on Dec. 9, 2021. The contents of the above applications are all incorporated by reference as if fully set forth herein in their entirety.

FIELD AND BACKGROUND OF THE INVENTION

The present disclosure relates to the technical field of display devices, and particularly to a display panel and a method for manufacturing the same.

BACKGROUND

With advancement of small-pitch Mini LED display technology, a distance between signal wires is getting smaller and smaller. When the distance is less than 0.5 mm, a display area of a display panel needs to be connected to an external driver by side bonding or back bonding. Currently, the biggest bottleneck of these two types of bonding is related to wires printed on a side surface of the display panel.

In the prior art, the wires are generally printed on the side surface with a silver paste. However, a resolution of the silver paste is not high, which easily leads to a connection between the wires and low yield. Therefore, the wires need to be separated by laser scribing. Furthermore, a stability of a printing process of the silver paste is not high. Once there is an error in control of process, such as preparation of the silver paste, a waiting time between processes (i.e. queue time, Q-time), cleaning of the silver paste remaining in a mold, it is easy to cause poor printing. Moreover, adhesion of the silver paste has a great relationship with a side grinding process of a glass substrate. The side grinding process brings a great risk of breakage to the glass substrate.

SUMMARY OF DISCLOSURE THE INVENTION

A purpose of the present disclosure is to provide a display panel and a method for manufacturing the same to solve technical problems in the prior art, such as a low stability of a silver paste printing process, a low yield of wires on a side surface, and a risk of glass breakage caused by side grinding.

In order to achieve the above purpose, the present disclosure provides a display panel. The display panel comprises a first bonding area and a second bonding area connected to the first bonding area. The display panel further comprises a substrate and a bonding wiring layer. A thickness of a part of the substrate in the second bonding area is less than a thickness of a part of the substrate in the first bonding area. The bonding wiring layer is disposed on surfaces of the parts of the substrate in the first bonding area and the second bonding area. A side surface of the bonding wiring layer away from the first bonding area and a side surface of the substrate away from the first bonding area are located on a same plane.

In an embodiment, the substrate comprises a body portion and an extension portion. The body portion is located in the first bonding area. The extension portion is connected with the body portion and is located in the second bonding area.

In an embodiment, a thickness of the extension portion is less than a thickness of the body portion.

In an embodiment, a surface of the body portion away from the bonding wiring layer and a surface of the extension portion away from the bonding wiring layer are located on a same plane.

In an embodiment, the bonding wiring layer comprises a first metal layer and a second metal layer. The first metal layer is disposed on the body portion and extends from the body portion to the extension portion. The second metal layer is disposed on a surface of the first metal layer away from the substrate.

In an embodiment, a thickness of the first metal layer is less than a thickness of the second metal layer.

In an embodiment, a total thickness of the body portion and the first metal layer is less than a total thickness of the extension portion, the first metal layer, and the second metal layer.

In an embodiment, the bonding wiring layer is made of copper.

In an embodiment, the display panel further comprises a display area disposed on a side of the first bonding area away from the second bonding area. The display panel further comprises a thin-film transistor and a chip-on-film. The thin-film transistor is disposed on a part of the substrate in the display area. The chip-on-film extends from a surface of the extension portion away from the bonding wiring layer to the side surface of the bonding wiring layer away from the first bonding area.

In an embodiment, an end of the bonding wiring layer located in the first bonding area is electrically connected to the thin-film transistor. The side surface of the bonding wiring layer away from the first bonding area is electrically connected to the chip-on-film.

In an embodiment, the display panel further comprises a light-emitting device disposed on the thin-film transistor.

The present disclosure further provides a method for manufacturing a display panel, comprising: providing a substrate comprising a first bonding area, a second bonding area, and a cut-off area, wherein the cut-off area is connected to the second bonding area, and a side of the second bonding area away from the cut-off area is connected to the first bonding area; forming a groove in the substrate; forming a bonding wiring layer on the substrate, wherein the bonding wiring layer covers the first bonding area, the second bonding area, and the cut-out area, and fills the groove; cutting the substrate and the bonding wiring layer along a cutting line, wherein the cutting line is a dividing line between the cut-out area and the second bonding area, and is located in the groove; and removing a part of the substrate and a part of the bonding wiring layer in the cut-out area.

In an embodiment, the forming the bonding wiring layer on the substrate comprises: forming a first metal layer on the substrate by deposition; and forming a second metal layer on the first metal layer by electroplating.

In an embodiment, the first metal layer uniformly covers a groove wall and a groove bottom of the groove, and a depth of the groove is less than a thickness of the second metal layer.

In an embodiment, the first metal layer and the second metal layer are made of copper.

In an embodiment, the forming the bonding wiring layer on the substrate further comprises: forming a photoresist layer on a part of the first metal layer; and after the second metal layer is formed, removing the photoresist layer and the part of the first metal layer covered by the photoresist layer.

In an embodiment, the forming the photoresist layer on the part of the first metal layer comprises: coating a photoresist material on a surface of the part of the first metal layer away from the substrate; and curing and patterning the photoresist material to form the photoresist layer that shields the part of the first metal layer.

In an embodiment, the cutting the substrate and the bonding wiring layer along the cutting line comprises: turning over the substrate, so that a surface of the substrate away from the bonding wiring layer faces a cutting device; cutting the substrate and the bonding wiring layer along the cutting line by a laser; and separating a part of the substrate and a part of the bonding wiring layer in the cut-out area from a part of the substrate and a part of the bonding wiring layer in the second bonding area.

In an embodiment, the substrate further comprises a display area disposed on a side of the first bonding area away from the second bonding area, and the method further comprises: forming a thin-film transistor on a part of the substrate in the display area; and attaching a chip-on-film on a surface of the substrate away from the bonding wiring layer and a surface of the bonding wiring layer away from the first bonding area.

In an embodiment, the method for manufacturing the display panel further comprises: forming a light-emitting device on the thin-film transistor.

The present disclosure has the following advantages. The display panel and the method for manufacturing the same provided by the present disclosure do not require a silver paste printing process, thereby solving problems of poor process stability and low yield of the silver paste printing process, and avoiding a risk of glass breakage caused by side grinding.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments of the present disclosure will be given below. Obviously, the accompanying drawings in the following description are merely some embodiments of the present disclosure. For those skilled in the art, other drawings may be obtained from these accompanying drawings without creative labor.

FIG. 1 (a) and 1 (b) are schematic diagrams of a layered structure of a display panel according to an embodiment of the present disclosure.

Elements in the accompanying drawings comprise a display pane 1, a first bonding area 1A, a second bonding area 1B, a display area 1C, a substrate 10, a body portion 11, an extension portion 12, a side surface 13 of the extension portion away from the body portion, a bonding wiring layer 20, a first metal layer 21, a second metal layer 22, a side surface 23 of the bonding wiring layer away from the body portion, a cut-off area 1D, a groove 14, and a photoresist layer 30.

DESCRIPTION OF SPECIFIC EMBODIMENTS OF THE INVENTION

Preferred embodiments of the present invention will be introduced with reference to accompanying drawings of the disclosure, so as to prove that the present invention can be implemented. The preferred embodiments can fully introduce the present invention to those skilled in the art, so that a technical solution of the present invention is clearer and easier to understand. The present invention can be embodied by various embodiments. The claimed scope of the present invention is not limited to the preferred embodiments described in the present disclosure.

Figure 1:
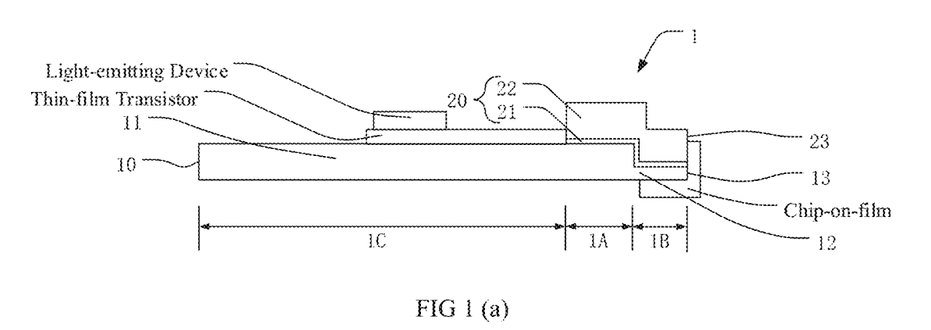

The present disclosure provides a display panel 1. The display panel 1 is configured to provide a display image for an electronic device. As shown in (a) and (b) of FIG. 1, the display panel 1 comprises a first bonding area 1A, a second bonding area 1B, and a display area 1C. The second bonding area 1B is connected to a side of the first bonding area 1A. The display area 1C is connected to a side of the first bonding area 1A away from the second bonding area 1B.

The display panel 1 further comprises a substrate 10 and a bonding wiring layer 20.

The substrate 10 is a rigid substrate, which may be made of glass, quartz, or the like. The substrate 10 comprises a body portion 11 and an extension portion 12. The body portion 11 covers the first bonding area 1A and the display area 1C. The extension portion 12 covers the second bonding area 1B and is connected to a side of the body portion 11. A thickness of the body portion 11 is greater than a thickness of the extension portion 12. A bottom surface of the extension portion 12 (that is, a surface of the extension portion 12 away from the bonding wiring layer 20) and a bottom surface of the body portion 11 (that is, a surface of the body portion 11 away from the bonding wiring layer 20) are located on a same plane. Therefore, a part of a side surface of the body portion 11 facing the extension portion 12 is exposed, and a bottom surface of the substrate 10 is flat, which is convenient for attaching an external driver on the bottom surface of the substrate 10.

A plurality of wires are arranged in the bonding wiring layer 20. The wires are arranged equidistantly on an edge of the substrate 10. As shown in (a) and (b) of FIG. 1, the bonding wiring layer 20 is disposed on a part of the body portion 11 in the first bonding area 1A, and extends from the body portion 11 to cover the extension portion 12 in the second bonding area 1B. A side surface 23 of the bonding wiring layer 20 away from the body portion 11 (that is, away from the first bonding area 1A) and a side surface 13 of the extension portion 12 away from the body portion 11 (that is, away from the first bonding area 1A) are located on a same plane, so that a conductive structure is formed on a side surface of the display panel 1. An end of the bonding wiring layer 20 located in the first bonding area 1A is electrically connected to a plurality of display elements in the display area 1C. An end of the bonding wiring layer 20 located on the side surface of the substrate 10 is electrically connected to the external driver. The external driver is connected to the display elements through the bonding wiring layer 20, so as to transmit a display signal to the display area 1C.

Specifically, the bonding wiring layer 20 comprises a first metal layer 21 and a second metal layer 22. The first metal layer 21 is disposed on the part of the body portion 11 and extends from a top surface of the part of the body portion 11 in the first bonding area 1A along the side surface of the body portion 11 facing the extension portion 12 to cover a top surface of the extension portion 12. The second metal layer 22 is disposed on a surface of the first metal layer 21 away from the substrate 10. Specifically, a thickness of the first metal layer 21 is less than a thickness of the second metal layer 22. A total thickness of the extension portion 12, the first metal layer 21, and the second metal layer 22 in the second bonding area 1B is greater than a total thickness of the body portion 11 and the second metal layer 22 in the first bonding area 1A, so that a part of the second metal layer 22 in the second bonding area 1B can be connected to a part of the second metal layer 22 in the first bonding area 1A.

In the display area 1C, the display elements of the display panel 1 comprises a plurality of thin-film transistors and light-emitting devices. The thin-film transistors are disposed in an array on the body portion 11 to form an array substrate, and are electrically connected to the bonding wiring layer 20 in the first bonding area 1A through signal wires. The light-emitting devices are disposed on the array substrate and are electrically connected to the thin-film transistors. The light-emitting devices may be organic light-emitting diodes (OLEDs), mini light-emitting diodes (mini-LEDs), micro light-emitting diode (micro-LEDs), etc. The display signal of the external driver is transmitted to the array substrate through the bonding wiring layer 20. The thin-film transistors in the array substrate control on or off of the light-emitting devices in pixel units according to the display signal, thereby controlling display and change of images.

The external driver comprises a chip-on-film (COF). The chip-on-film is disposed on a surface of the substrate 10 away from the thin film transistors, extends from the bottom surface of the extension portion 12 (that is, the surface of the extension portion 12 away from the bonding wiring layer 20) to cover the side surface 23 of the bonding wiring layer 20 (that is, a surface of the bonding wiring layer 20 away from the first bonding area 1A), and is electrically connected to the thin-film transistors through the bonding wiring layer 20. Specifically, the chip-on-film comprises an integrated circuit (IC) chip and a flexible printed circuit board (FPC). The flexible printed circuit board is disposed on the substrate 10, extends from the bottom surface of the extension portion 12 of the substrate 10 to the side surface 23 of the bonding wiring layer 20, and is electrically connected to the bonding wiring layer 20, as shown in (a) of FIG. 1. The 1C chip is disposed on the flexible printed circuit board and the bottom surface of the substrate 10. The 1C chip is configured to provide the display signal. The display signal is transmitted to the thin-film transistors of the array substrate through the flexible printed circuit board and the bonding wiring layer 20 in sequence. In the chip-on-film, an additional flexible circuit board (i.e., the flexible printed circuit board) is configured as a carrier for a packaged chip (i.e., the 1C chip), connects the packaged chip to a circuit of the array substrate, and transmits the display signal to the display panel 1.

The side surface 23 of the bonding wiring layer 20 is flush with the side surface of the substrate 10, so that the external driver can be electrically connected to the array substrate on the side surface of the display panel 1. This greatly reduces a frame width of the display panel 1, enlarges an area of the display area 1C, and increases a screen-to-body ratio, thereby realizing a narrow frame display, and improving user experience.

Figure 2:
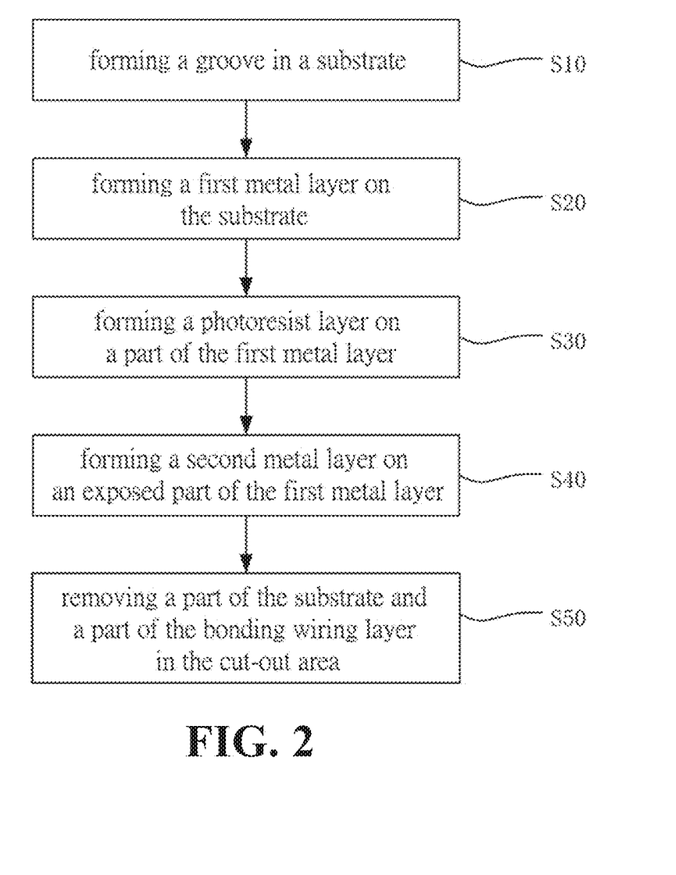
FIG. 2 is a schematic flowchart of a method for manufacturing the display panel according to an embodiment of the present disclosure.

The present disclosure further provides a method for manufacturing a display panel 1. The method is used to manufacture the aforementioned display panel 1. Specifically, the method for manufacturing the display panel 1 comprises the following steps, as shown in the flowchart of FIG. 2.

Figure 3:
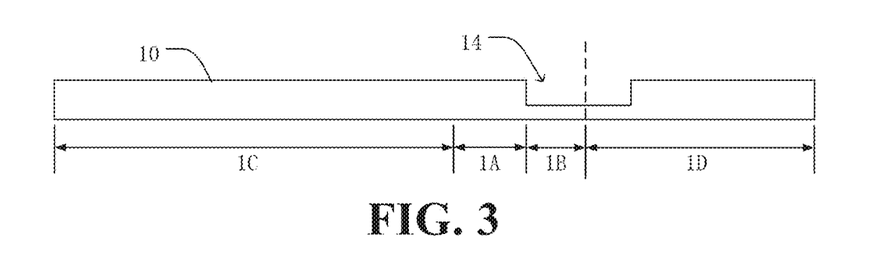
FIG. 3 is a schematic diagram of a layered structure of a substrate after step S10 according to an embodiment of the present disclosure.

Step S10: forming a groove 14 in a substrate 10.

As shown in FIG. 3, the substrate 10 is provided. A cutting line is provided on the substrate 10. The cutting line is shown as a dashed line in FIG. 3. A cut-off area 1D is located on a side of the cutting line, and a second bonding area 1B of the display panel 1 is located on the other side of the cutting line. The groove 14 is formed on a surface of the substrate 10 by laser. The groove 14 extends from the second bonding area 1B to the cut-out area 1D. The cutting line is located in the groove 14.

Figure 4:
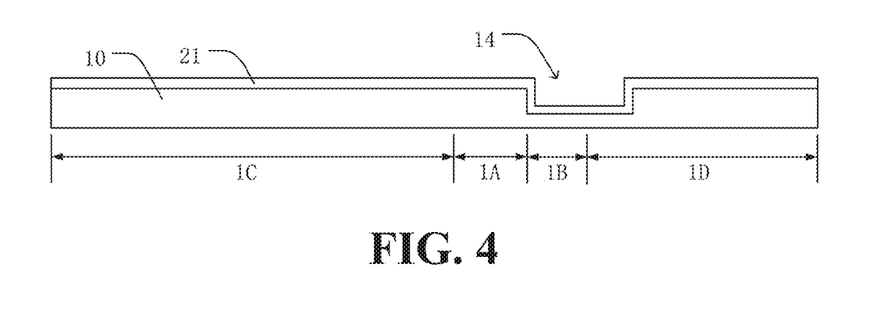
FIG. 4 is a schematic diagram of a layered structure of the display panel after step S20 according to an embodiment of the present disclosure.

Step S20: forming a first metal layer 21 on the substrate 10.

As shown in FIG. 4, a metal film is deposited on a surface of the substrate 10 where the groove 14 is formed by physical vapor deposition (PVD) to form the first metal layer 21. The first metal layer 21 uniformly covers the first bonding area 1A, the second bonding area 1B, the display area 1C, and the cut-out area 1D. The metal film is a copper film.

Figure 5:
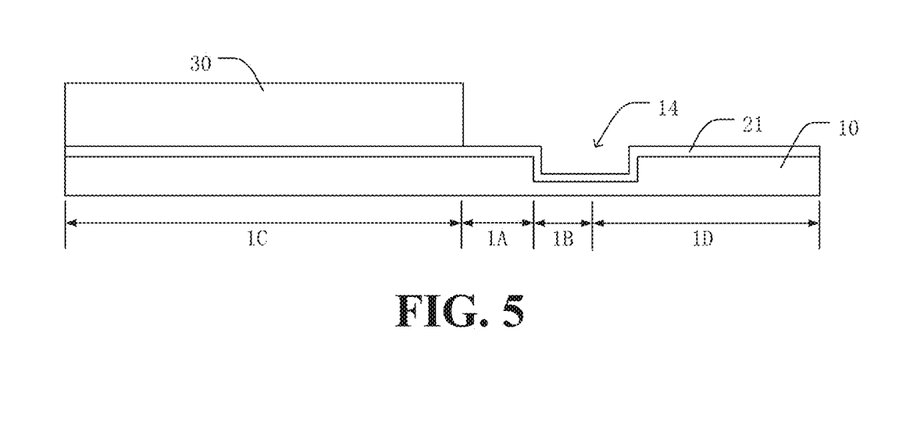
FIG. 5 is a schematic diagram of the layered structure of the display panel after step S30 according to an embodiment of the present disclosure.

Step S30: forming a photoresist layer 30 on a part of the first metal layer 21.

As shown in FIG. 5, a photoresist material is coated on a surface of the part of the first metal layer 21 away from the substrate 10. The photoresist material is cured and patterned by a yellow light process to form the photoresist layer 30 that shields the part of the first metal layer 21.

Figure 6:
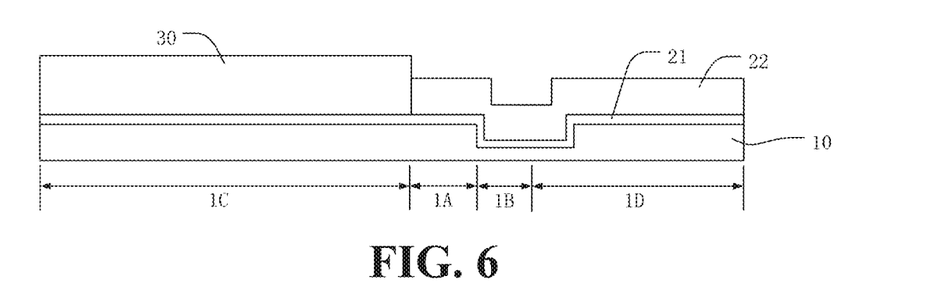
FIG. 6 is a schematic diagram of the layered structure of the display panel in step S40 according to an embodiment of the present disclosure.

Step S40: forming a second metal layer 22 on an exposed part of the first metal layer 21.

Figure 7:
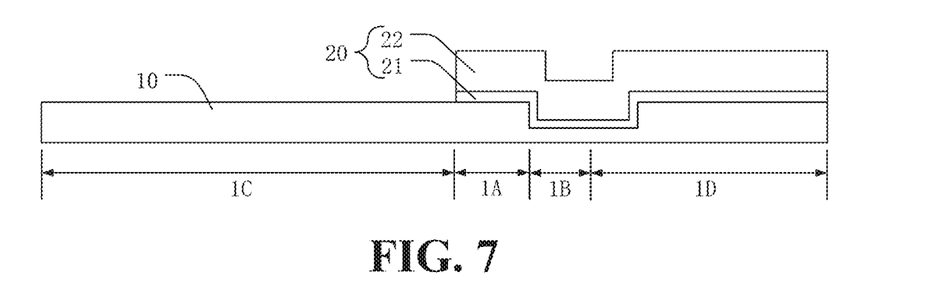
FIG. 7 is a schematic diagram of the layered structure of the display panel after step S40 according to an embodiment of the present disclosure.

As shown in FIG. 6, a layer of copper is formed on the exposed part of the first metal layer 21 by electroplating to form the second metal layer 22. The second metal layer 22 fills the groove 14. As shown in FIG. 7, the photoresist layer 30 in the display area 1C and the part of the first metal layer 21 covered by the photoresist layer 30 are removed by an etching solution, leaving the second metal layer 22 and a part of the first metal layer 21 covered by the second metal layer 22. The second metal layer 22 and the first metal layer 21 are combined to form a bonding wiring layer 20.

Figure 8:
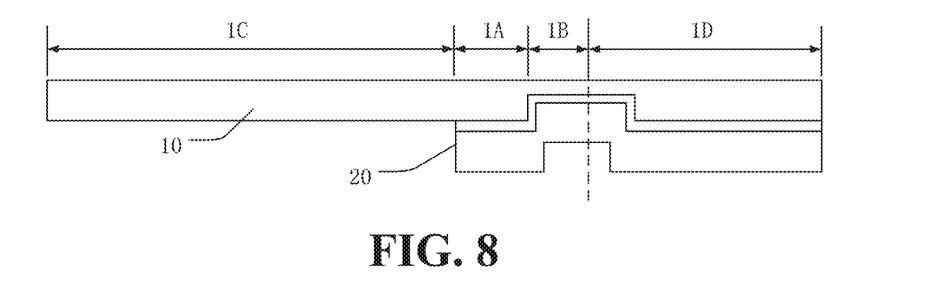
FIG. 8 is a schematic diagram of the layered structure of the display panel in step S50 according to an embodiment of the present disclosure.

Step S50: removing a part of the substrate 10 and a part of the bonding wiring layer 20 in the cut-out area 1D.

As shown in FIG. 8, the substrate 10 is turned over, and the bottom surface of the substrate 10 away from the bonding wiring layer 20 faces a cutting device. The substrate 10 and the bonding wiring layer 20 are cut along the cutting line by a laser. The part of the substrate 10 and the part of the bonding wiring layer 20 in the cut-out area 1D are separated from a part of the substrate 10 and a part of the bonding wiring layer 20 in the second bonding area 1B. The part of the substrate 10 and the part of the bonding wiring layer 20 in the cut-out area 1D are removed to form the display panel 1 as shown in (a) and (b) of FIG. 1. A side surface 23 of the bonding wiring layer 20 away from the first bonding area 1A and a side surface 13 of the extension portion 12 away from the first bonding area 1A are located on a same plane, so that a conductive structure is formed on a side surface of the display panel 1.

Step S60: forming an array substrate and a plurality of light-emitting devices.

A plurality of thin-film transistors (TFTs) and a plurality of signal wires connecting the thin-film transistors and the bonding wiring layer 20 are formed on a surface of a part of the substrate 10 in the display area 1C by a thin-film transistor process. The light-emitting devices are formed on a surface of the array substrate away from the substrate through an OLED manufacturing process, a mass transfer process, or the like, and are electrically connected to the thin-film transistors.

Step S70: bonding a chip-on-film.

The chip-on-film is provided. The chip-on-film comprises a flexible printed circuit board and an integrated circuit (IC) chip disposed on the flexible printed circuit board. An end of the flexible printed circuit board is attached on the side surface 13 of the extension portion 12 away from the body portion 11, and extends from the side surface 13 to the side surface 23 of the bonding wiring layer 20 away from the body portion 11, as shown in (b) of FIG. 1, so that the flexible printed circuit board is electrically connected to the bonding wiring layer 20. And, an end of the flexible printed circuit board away from the bonding wiring layer 20 is fixed on the bottom surface of the substrate 10 to complete the bonding of the chip-on-film.

In the display panel and the method for manufacturing the same provided by the present disclosure, a new side bonding structure is formed through a new manufacturing process. There is no need to use a silver paste printing process, thereby solving problems of poor process stability and low yield of the silver paste printing process, and avoiding a risk of glass breakage caused by side grinding. Furthermore, the bonding wiring layer in the present disclosure is formed by electroplating, which can increase an application range of an electroplating equipment and make full use of a production equipment.

Although the present invention is described herein with reference to specific embodiments, it should be understood that these embodiments are merely examples of principles and applications of the present invention. Therefore, it should be understood that modifications can be made to exemplary embodiments, and other arrangements can be devised as long as they do not deviate from the spirit and scope of the present invention as defined by the appended claims. It should be understood that different dependent claims and features described herein can be combined in ways different from those described in the original claims. It can also be understood that features described in a single embodiment can be applied in other embodiments.

What is claimed is:

1. A display panel, comprising a first bonding area and a second bonding area connected to the first bonding area, and further comprising:
   a substrate, wherein a thickness of a part of the substrate in the second bonding area is less than a thickness of a part of the substrate in the first bonding area; and
   a bonding wiring layer disposed on the substrate and in the first bonding area and the second bonding area, wherein a side surface of the bonding wiring layer away from the first bonding area and a side surface of the substrate away from the first bonding area are located on a same plane,
   wherein the substrate comprises a first surface and a second surface closer to the bonding wiring layer than the first surface and opposite the first surface, in a direction perpendicular to the first surface, a distance between a surface of the bonding wiring layer away from the substrate and the first surface in the second bonding area is greater than a distance between the first surface and the second surface in the first bonding area,
   wherein the substrate comprises: a body portion located in the first bonding area; and an extension portion connected with the body portion and located in the second bonding area,
   wherein the bonding wiring layer comprises: a first metal layer disposed on the body portion and extending from the body portion to the extension portion; and a second metal layer disposed on a surface of the first metal layer away from the substrate, and
   wherein a total thickness of the body portion and the first metal layer is less than a total thickness of the extension portion, the first metal layer, and the second metal layer.

2. The display panel according to claim 1, wherein a thickness of the extension portion is less than a thickness of the body portion.

3. The display panel according to claim 1, wherein a surface of the body portion away from the bonding wiring layer and a surface of the extension portion away from the bonding wiring layer are located on a same plane.

4. The display panel according to claim 1, wherein a thickness of the first metal layer is less than a thickness of the second metal layer.

5. The display panel according to claim 1, wherein the bonding wiring layer is made of copper.

6. The display panel according to claim 1, further comprising a display area disposed on a side of the first bonding area away from the second bonding area, and further comprising:
   a thin-film transistor disposed on a part of the substrate in the display area; and
   a chip-on-film extending from a surface of the extension portion away from the bonding wiring layer to the side surface of the bonding wiring layer away from the first bonding area.

7. The display panel according to claim 6, wherein an end of the bonding wiring layer located in the first bonding area is electrically connected to the thin-film transistor, and the side surface of the bonding wiring layer away from the first bonding area is electrically connected to the chip-on-film.

8. The display panel according to claim 6, further comprising a light-emitting device disposed on the thin-film transistor.

9. A method for manufacturing a display panel, comprising:
   providing a substrate comprising a first bonding area, a second bonding area, and a cut-off area, wherein the cut-off area is connected to the second bonding area, and a side of the second bonding area away from the cut-off area is connected to the first bonding area;
   forming a groove in the substrate;
   forming a bonding wiring layer on the substrate, wherein the bonding wiring layer covers the first bonding area, the second bonding area, and the cut-out area, and fills the groove;
   cutting the substrate and the bonding wiring layer along a cutting line, wherein the cutting line is a dividing line between the cut-out area and the second bonding area, and is located in the groove; and
   removing a part of the substrate and a part of the bonding wiring layer in the cut-out area.

10. The method for manufacturing the display panel according to claim 9, wherein the forming the bonding wiring layer on the substrate comprises:
   forming a first metal layer on the substrate by deposition; and
   forming a second metal layer on the first metal layer by electroplating.

11. The method for manufacturing the display panel according to claim 10, wherein the first metal layer uniformly covers a groove wall and a groove bottom of the groove, and a depth of the groove is less than a thickness of the second metal layer.

12. The method for manufacturing the display panel according to claim 10, wherein the first metal layer and the second metal layer are made of copper.

13. The method for manufacturing the display panel according to claim 10, wherein the forming the bonding wiring layer on the substrate further comprises:
   forming a photoresist layer on a part of the first metal layer; and
   after the second metal layer is formed, removing the photoresist layer and the part of the first metal layer covered by the photoresist layer.

14. The method for manufacturing the display panel according to claim 13, wherein the forming the photoresist layer on the part of the first metal layer comprises:
   coating a photoresist material on a surface of the part of the first metal layer away from the substrate; and
   curing and patterning the photoresist material to form the photoresist layer that shields the part of the first metal layer.

15. The method for manufacturing the display panel according to claim 9, wherein the cutting the substrate and the bonding wiring layer along the cutting line comprises:
   turning over the substrate, so that a surface of the substrate away from the bonding wiring layer faces a cutting device;
   cutting the substrate and the bonding wiring layer along the cutting line by a laser emitted by the cutting device; and
   separating a part of the substrate and a part of the bonding wiring layer in the cut-out area from a part of the substrate and a part of the bonding wiring layer in the second bonding area.

16. The method for manufacturing the display panel according to claim 9, wherein the substrate further comprises a display area disposed on a side of the first bonding area away from the second bonding area, and the method further comprises:
   forming a thin-film transistor on a part of the substrate in the display area; and
   attaching a chip-on-film on a surface of the substrate away from the bonding wiring layer and a surface of the bonding wiring layer away from the first bonding area.

17. The method for manufacturing the display panel according to claim 16, further comprising:
   forming a light-emitting device on the thin-film transistor.

* * * * *